United States Patent [19]
Gelatos

[11] Patent Number: 5,275,973
[45] Date of Patent: Jan. 4, 1994

[54] METHOD FOR FORMING METALLIZATION IN AN INTEGRATED CIRCUIT

[75] Inventor: Avgerinos V. Gelatos, Austin, Tex.

[73] Assignee: Motorola, Inc., Schaumburg, Ill.

[21] Appl. No.: 24,150

[22] Filed: Mar. 1, 1993

[51] Int. Cl.$^5$ .................. H01L 21/283; H01L 21/31
[52] U.S. Cl. .................... 437/195; 437/183; 437/228; 437/944; 437/230; 437/190; 437/192; 437/229; 156/653; 156/656; 156/659.1
[58] Field of Search ............... 437/195, 228, 183, 944, 437/230, 190, 192, 229; 427/98; 156/656, 653, 659.1

[56] References Cited

U.S. PATENT DOCUMENTS

| | | | |
|---|---|---|---|
| 4,389,281 | 6/1983 | Anantha et al. | 156/646 |
| 4,641,420 | 2/1987 | Lee | 148/DIG. 20 |
| 4,755,478 | 7/1988 | Abernathey et al. | 437/41 |
| 4,866,008 | 9/1989 | Brighton et al. | 437/198 |
| 4,948,745 | 8/1990 | Pfiester et al. | 437/41 |
| 4,961,822 | 10/1990 | Liao et al. | 156/656 |
| 4,997,790 | 3/1991 | Woo et al. | 437/195 |
| 5,026,666 | 6/1991 | Hills et al. | 437/195 |
| 5,063,169 | 11/1991 | De Bruin et al. | 437/41 |
| 5,127,986 | 7/1992 | August et al. | 156/643 |
| 5,130,229 | 7/1992 | Chang et al. | 430/312 |
| 5,158,910 | 10/1992 | Cooper et al. | 437/195 |
| 5,169,680 | 12/1992 | Tiny et al. | 427/98 |

FOREIGN PATENT DOCUMENTS

| | | | |
|---|---|---|---|
| 54-161285 | 12/1979 | Japan | 437/190 |
| 58-202555 | 11/1983 | Japan | 437/190 |
| 4-84422 | 3/1992 | Japan | 437/230 |

OTHER PUBLICATIONS

Wolf, S., et al., Silicon Processing, vol. 1, 1986, Lattice Press, pp. 321-322.

Primary Examiner—T. N. Quach
Attorney, Agent, or Firm—James L. Clingan, Jr.; Kent J. Cooper

[57] ABSTRACT

Metallization having a self-aligned diffusion barrier or seed layer is formed in an integrated circuit. In one embodiment of the invention, a sacrificial material (20) is used to define a seed layer (24). A dielectric layer (26) is then formed and the sacrificial material (20) is subsequently removed to expose the underlying seed layer (24). A conductive layer of material (32), such as copper, is then selectively deposited onto the seed layer (24). Because the diffusion barrier or seed layer is self-aligned the metal to metal spacing in an integrated circuit may be reduced. Therefore, integrated circuits having high device packing densities can be fabricated.

20 Claims, 3 Drawing Sheets

METHOD FOR FORMING METALLIZATION IN AN INTEGRATED CIRCUIT

FIELD OF THE INVENTION

This invention relates generally to integrated circuits, and more specifically to a method for forming metallization in an integrated circuit.

BACKGROUND OF THE INVENTION

Modern integrated circuits contain thousands of semiconducting devices on a single chip, and as the device density of a given chip increases more levels of metallization are required to interconnect the devices. Moreover, within a given metal level the horizontal distance separating metallization lines must be reduced in order to minimize the chip's size, as the device density increases. At the same time, metallization resistance must be minimized in order to meet the chip's speed and performance requirements. Traditionally, aluminum and aluminum alloys have been used throughout the semiconductor industry for integrated circuit metallization. The semiconductor industry's continuing demand, however, for integrated circuits with ever increasing device densities requires new metallization materials having higher electrical conductivity and higher electromigration resistance than can be obtained with traditional aluminum based metallization. Therefore, several alternatives to aluminum based metallization have been proposed for use in advanced integrated circuits.

Copper, silver, and gold are some of the alternative metallization materials that have been proposed. Their electrical conductivities are higher than aluminum, or its alloys, and at the same time their resistance to electromigration is higher than traditional aluminum based metallization. Moreover, copper can be selectively deposited and therefore it does not have to be patterned with a separate processing step. These well-known advantages make these metallization materials attractive for advanced integrated circuits.

Many of these alternative metallization materials, however, rapidly diffuse through dielectric materials, and thus they may adversely effect the integrated circuit's reliability and functionality. Therefore, barrier layers between the metallization and the dielectric layers are often required to prevent diffusion. In addition, metallization formed by selective deposition requires a nucleation layer or seed layer to promote preferential deposition. Unfortunately, barrier layers and seed layers often limit reductions in the horizontal distance separating adjacent metal lines. Therefore, the ability to achieve integrated circuits with high device packing densities is limited with these alternative metallization materials. Accordingly, a need exists for a metallization process that allows the fabrication of integrated circuits with high device packing densities.

SUMMARY OF THE INVENTION

The previously mentioned problems with metallization processes are overcome by the present invention. In one embodiment of the invention, metallization in an integrated circuit is formed by providing a substrate. A device layer is formed overlying the substrate. A sacrificial layer of material is then deposited overlying the device layer. The sacrificial layer of material is then patterned to form a patterned portion of the sacrificial layer and to form an exposed portion of the device layer. The exposed portion of the device layer is then etched to form a remaining portion of the device layer underlying the patterned portion of the sacrificial layer. A dielectric layer is then formed overlying the substrate and exposing the patterned portion of the sacrificial layer. The patterned portion of the sacrificial layer is then removed to expose the remaining portion of the device layer and to form an exposed sidewall portion of the dielectric layer. A conductive layer is then deposited onto the remaining portion of the device layer.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
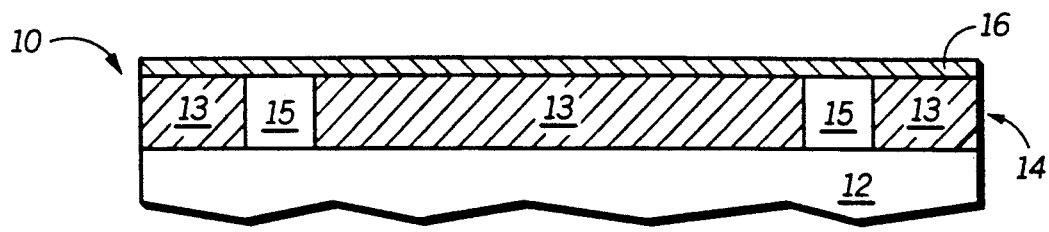
FIGS. 1, 2, 3, 4, 5, 6, 7, 8 and 9 illustrate, in cross-section, process steps in accordance with one embodiment of the invention.

FIGS. 1 through 8 illustrate, in cross-section, process steps in accordance with one embodiment of the invention wherein metallization in an integrated circuit is formed. Shown in FIG. 1 is a portion 10 of an integrated circuit structure comprising a substrate 12, interconnect layer 14, and a device layer 16. Substrate 12 is preferably a semiconductor substrate having semiconducting devices such as transistors, capacitors, resistors, diodes, et cetera formed thereon. These devices, however, are not shown in order to simplify the drawings. Interconnect layer 14 has a first dielectric portion 13 that is used for electrical isolation and a second conductive contact or via portion 15 that is used for forming electrical interconnects between different levels of interconnect metallization or for forming electrical interconnects between underlying devices and an overlying level of interconnect metallization. Interconnect layer 14 may be formed using well-known isolation and metallization processes or it may be formed using the inventive process itself. Device layer 16 is preferably titanium nitride and is formed using conventional techniques. Alternatively, other conductive materials such as titanium-tungsten, tungsten, molybdenum, et cetera may also be used. Interconnect level 14, however, is optional and its location and use within integrated circuit structure 10 depends on the type and level of metallization to be formed with the inventive process.

For example, as shown in FIG. 1, interconnect layer 14 may lie directly on substrate 12. In this embodiment of the invention, first portion 13 of interconnect layer 14 provides electrical isolation between underlying substrate 12 and overlying interconnect metallization 33 that is formed with the inventive process. Additionally, second portion 15 of interconnect layer 14 forms an electrical interconnect between underlying devices (not shown) on substrate 12 and overlying interconnect metallization 33 that is formed with the inventive process. In this embodiment, device layer 16 is also formed overlying interconnect layer 14, as shown in FIG. 1.

Figure 2:
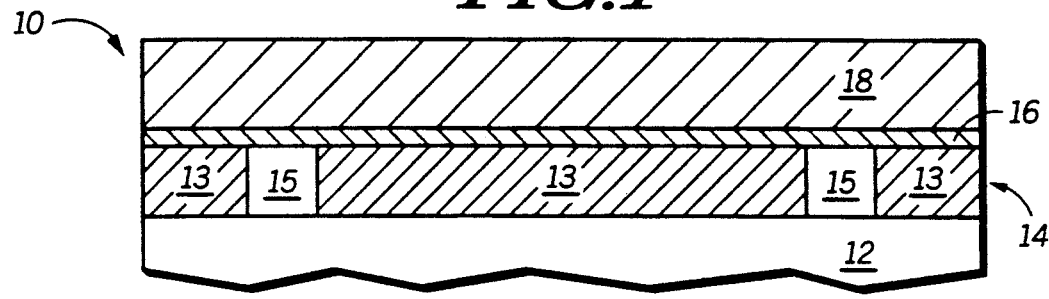

In FIG. 2, a sacrificial layer 18 of material is then deposited overlying device layer 16. Sacrificial layer 18 is preferably a layer of photoresist. Alternatively, sacrificial layer 18 may be another material that is also imagible, such as polyimide. In addition, sacrificial layer 18 has a thickness that is approximately the same as the final desired thickness of conductive layer 32.

Figure 3:
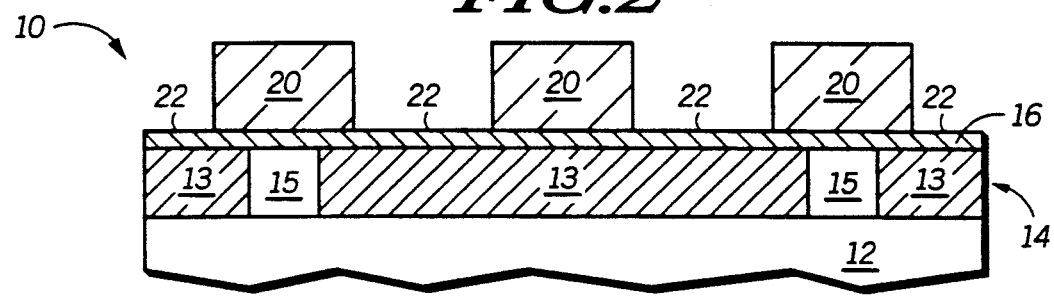

In FIG. 3, sacrificial layer 18 is patterned using conventional photolithographic techniques, such as E-beam, X-ray, or optical lithography, to form a remaining portion 20 of sacrificial layer 18 overlying device layer 16. This patterning process also forms an exposed portion 22 of device layer 16.

Figure 4:
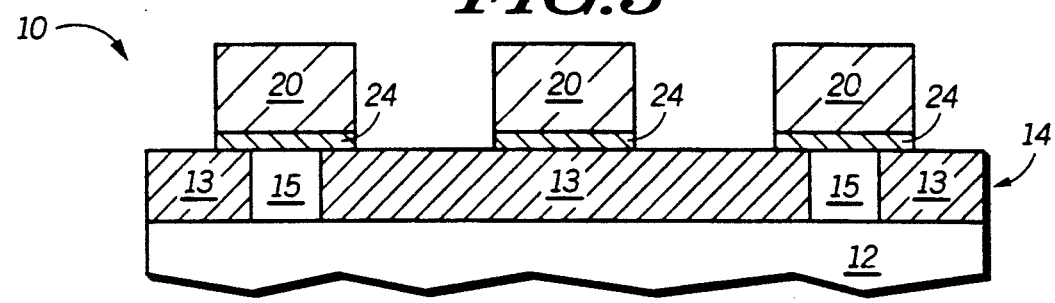

In FIG. 4, using conventional etching techniques exposed portion 22 of device layer 16 is anisotropically etched leaving a remaining portion 24 of device layer 16 underlying remaining portion 20 of sacrificial layer 18.

Figure 5:
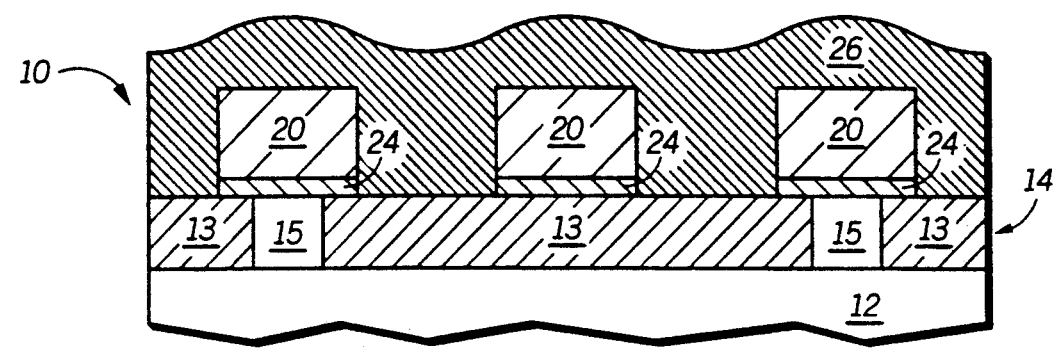

In FIG. 5, a dielectric layer 26 is then deposited overlying substrate 12 and remaining portion 20 of sacrificial layer 18. Dielectric layer 26 is preferably silicon dioxide and may be deposited using a spin-on-glass technique, or plasma enhanced chemical vapor deposition (PECVD), or electron cyclotron resonance (ECR) deposition. Alternatively, dielectric layer 26 may be another material that can be deposited such that it does not substantially alter remaining portion 20, such as plasma enhanced chemically vapor deposited (PECVD) silicon nitride.

Figure 6:
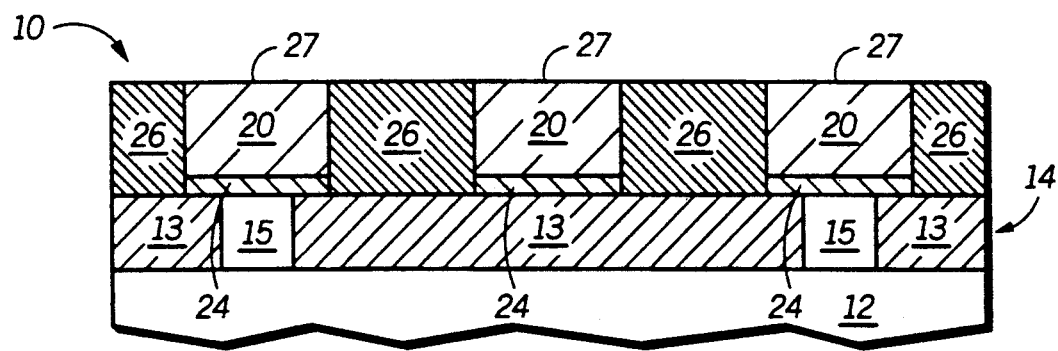

In FIG. 6, a portion of dielectric layer 26 is then removed in order to expose the top surface 27 of remaining portion 20. Top surface 27 may be exposed using conventional etch back techniques. Alternatively, top surface 27 may be exposed using chemical-mechanical polishing. It should be noted, however, that the removal process may be optional if dielectric layer 26 is formed such that top surface 27 is left exposed after deposition is completed. For example, an ECR deposition system having an in-situ etch back process may be used to achieve this result.

Figure 7:
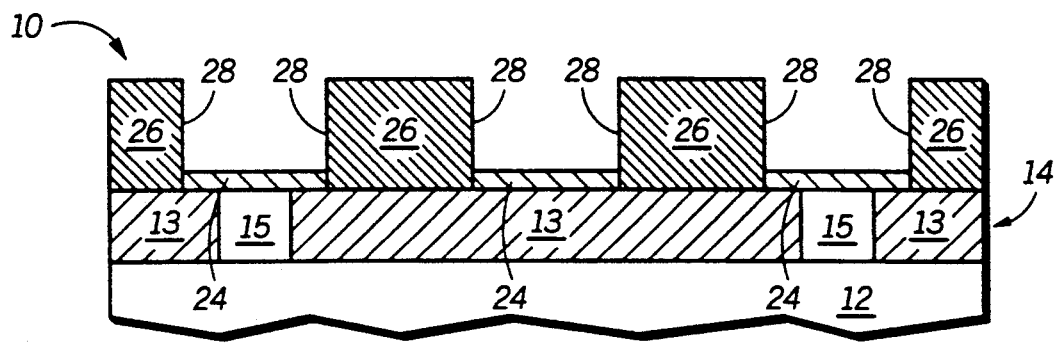

In FIG. 7, remaining portion 20 of sacrificial layer 18 is removed without substantially altering dielectric layer 26 or remaining portion 24 of device layer 16. In addition to exposing remaining portion 24, the removal process also exposes a sidewall portion 28 of dielectric layer 26. Remaining portion 20 is preferably removed or etched using an oxygen plasma.

Figure 8:
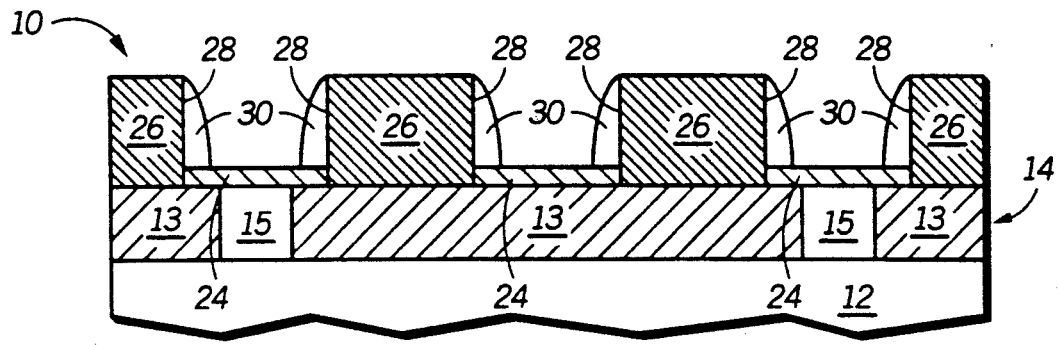

In FIG. 8, a barrier layer is then deposited and etched using conventional techniques to form a sidewall spacer 30 adjacent to exposed sidewall portion 28. Sidewall spacer 30 is preferably silicon nitride. Alternatively, other materials may also be used as a diffusion barrier. The sidewall spacer fabrication process, however, is optional if dielectric layer 26 acts as a diffusion barrier.

Figure 9:
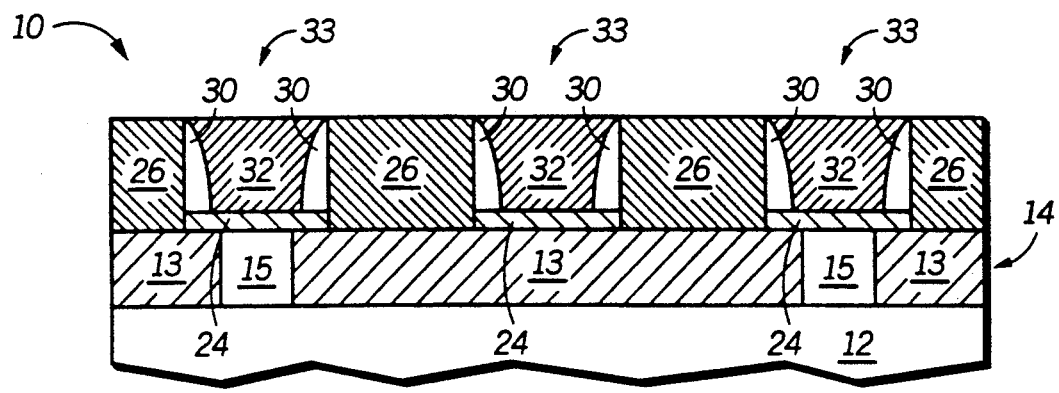

In FIG. 9, a conductive layer 32 is then selectively deposited onto remaining portion 24, which acts as a seed layer for the selective deposition process, to form interconnect metallization 33. Conductive layer 32 is preferably selective copper and is deposited using a liquid source of copper hexafluoroacetyl acetonate trimethyl vinyl silane and a nitrogen carrier gas. The source gas is heated to approximately 40 degrees centigrade and the copper is selectively deposited with a deposition temperature of approximately 250 degrees centigrade and a deposition pressure of approximately 0.5 torr. Other chemistries, however, may also be used to selectively deposit copper. Alternatively, other conductive materials that can be selectively deposited such as tungsten may also be used. Moreover, conductive layer 32 may also be deposited using a non-selective deposition process such as blanket chemical vapor deposition or sputter deposition. If conductive layer 32 is deposited using a non-selective process, then an additional etch back or polishing step may be used to remove a portion of conductive layer 32 and thus form a structure similar to that shown in FIG. 9.

Alternatively, the same inventive process may be used at other locations within integrated circuit structure 10 to form metallization. For example, interconnect layer 14 may directly overlie another level of interconnect metallization, such as the second level of interconnect metallization. In this alternative embodiment of the invention, which is not shown, first portion 13 of interconnect layer 14 provides electrical isolation between the underlying second level of interconnect metallization and the overlying third level of interconnect metallization that is formed using the inventive process. Additionally, for this embodiment second portion 15 of interconnect level 14 forms an electrical interconnect between portions of the underlying second level of interconnect metallization and portions of the overlying third level of interconnect metallization that is formed with the inventive process.

Additionally, the inventive process may be used to form interconnect layer 14 itself. For example, device layer 16 may be formed on substrate 12 such that it makes direct electrical contact with the semiconductor devices on substrate 12. The subsequent contact metallization formed with this alternative embodiment, which is not shown, is then used to form an electrical interconnect between the semiconducting devices on substrate 12 and an overlying level of interconnect metallization that is subsequently formed. Similarly, the inventive process may be used to form interconnect layer 14 when it is located between two different levels of interconnect metallization. For example, device layer 16 may be formed on the integrated circuit structure shown in FIG. 9 such that it is in electrical contact with a portion of interconnect metallization 33. The subsequent via metallization formed with this alternative embodiment, which is not shown, is then used to form an electrical interconnect between portions of interconnect metallization 33, and an additional level of interconnect metallization that is subsequently formed. Thus it is readily apparent that the inventive process may be used to form contact, via, and interconnect metallization throughout integrated circuit structure 10.

Figure 10:
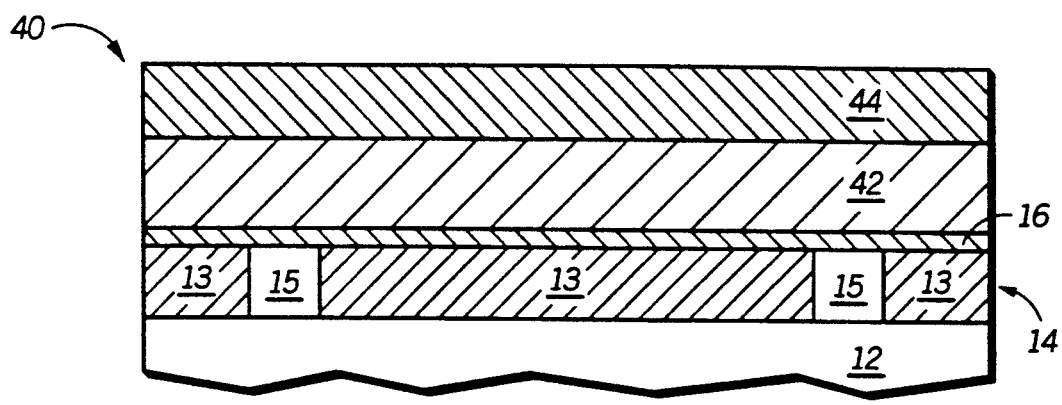
FIGS. 10, 11, 12 and 13 illustrate, in cross-section, process steps in accordance with another embodiment of the invention.

FIG.'S 10 through 13 illustrate, in cross-section, process steps in accordance with another embodiment of the invention wherein metallization in an integrated circuit is formed. Shown in FIG. 10, is a portion 40 of an integrated circuit structure comprising a substrate 12 as previously described, interconnect layer 14 as previously described, a device layer 16 as previously described, a sacrificial layer 42 analogous to sacrificial layer 18 in FIG. 2, and a photoresist layer 46. Sacrificial layer 42 is preferably a silicon dioxide dielectric layer that is deposited using conventional techniques. Alternatively, sacrificial layer 14 may be another material such as a boron-rich layer of boron nitride. As previously mentioned, interconnect level 14 is optional and its location and use within integrated circuit structure 40 depends on the type and level of metallization to be formed with the inventive process.

For example, as shown in FIG. 10, interconnect layer 14 may lie directly on substrate 12. In this embodiment of the invention first portion 13 of interconnect layer 14 provides electrical isolation between underlying substrate 12 and the interconnect metallization that is formed with the inventive process. Additionally, in this embodiment second portion 15 of interconnect layer 14 forms an electrical interconnect between underlying devices (not shown) on substrate 12 and the interconnect metallization that is formed with the inventive process. In this embodiment of the invention device layer 16 is formed overlying interconnect layer 14, as shown in FIG. 10. Sacrificial layer 42 of material is then deposited overlying device layer 16 and has a thickness that is approximately the same as the final desired thickness of the conductive layer. Photoresist layer 44 is then deposited overlying sacrificial layer 42 using conventional techniques.

Figure 11:
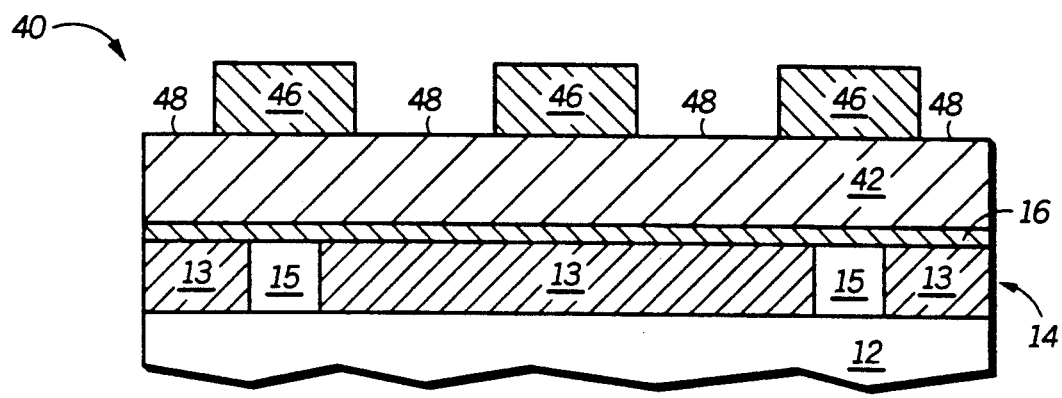

In FIG. 11, photoresist layer 44 is patterned using conventional photolithographic techniques to form a remaining portion 46 of photoresist layer 44 overlying sacrificial layer 42. This patterning process also forms an exposed portion 48 of sacrificial layer 42.

Figure 12:
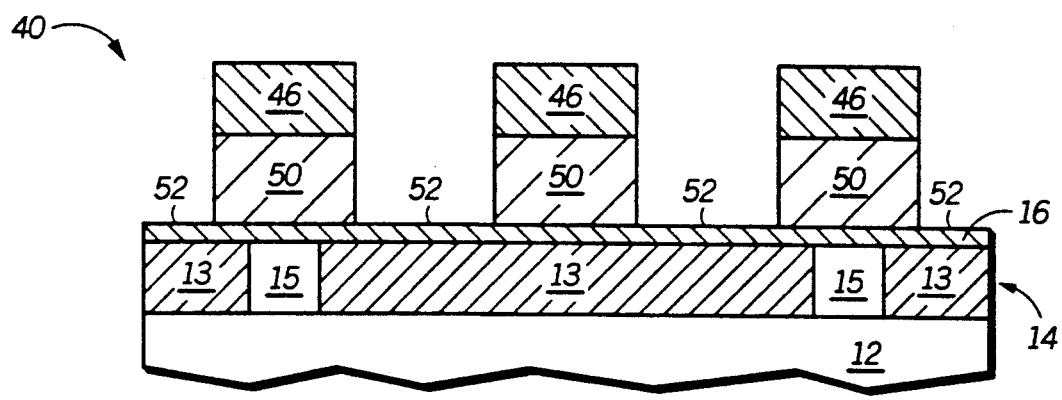

In FIG. 12, using conventional etching techniques exposed portion 48 of sacrificial layer 42 is then anisotropically etched leaving a remaining portion 50 of sacrificial layer 42 underlying remaining portion 46 of photoresist layer 44. This patterning process also forms an exposed portion 52 of device layer 16.

Figure 13:
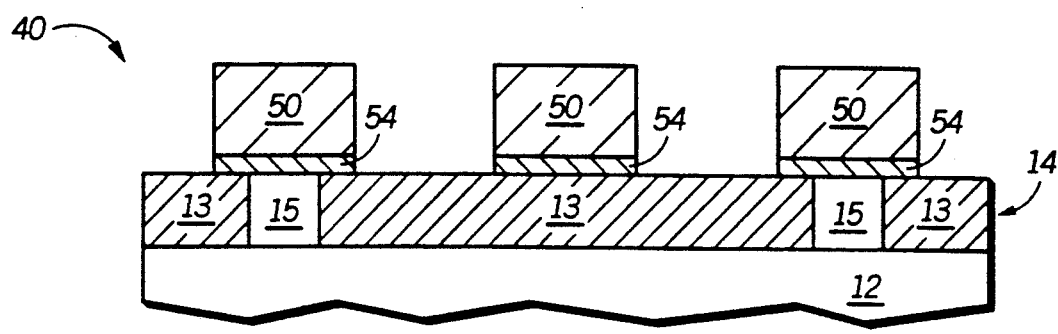

In FIG. 13, using conventional etching techniques exposed portion 52 of device layer 16 is then anisotropically etched leaving a remaining portion 54 of device layer 16 underlying remaining portion 50 of sacrificial layer 42. Remaining portion 46 of photoresist layer 44 is then removed using conventional techniques to form a structure similar to that shown in FIG. 4. Alternatively, remaining portion 46 may be removed before exposed portion 52 is removed.

The metallization process now continues in a manner similar to that shown in FIG.'S 5-9. A dielectric layer is deposited overlying substrate 12 and remaining portion 50 of sacrificial layer 42. The dielectric layer is preferably PECVD silicon nitride. Alternatively, other dielectric layers such as PECVD boron nitride, boro-oxynitride, or the like, may also be used.

A portion of the dielectric layer is then removed in order to expose the top surface of remaining portion 50. The top surface of remaining portion 50 may be exposed using conventional etch back techniques. Alternatively, it may also be exposed using chemical-mechanical polishing. It should be noted again, however, that the removal process may be optional if the dielectric layer is formed such that top surface of remaining portion 50 is left exposed after deposition is completed. For example, an ECR deposition system having an in-situ etch back process may be used to achieve this result.

The remaining portion 50 of sacrificial layer 42 is then removed without substantially altering the dielectric layer or remaining portion 54 of device layer 16. In addition to exposing remaining portion 54, the removal process also exposes a sidewall portion of the dielectric layer. Remaining portion 50 is preferably removed using hydrofluoric acid.

If silicon nitride is used for the dielectric layer, then the sidewall spacer, analogous to that shown in FIG. 8, is optional. If the dielectric layer, however, does not act as a diffusion barrier, then a sidewall spacer may be formed as previously described.

A conductive layer is then selectively deposited onto remaining portion 54, which acts as a seed layer for the selective deposition process, to form the interconnect metallization. The conductive layer is preferably selective copper and is deposited using a liquid source of copper hexafluoroacetyl acetonate trimethyl vinyl silane and a nitrogen carrier gas. The source gas is heated to approximately 40 degrees centigrade and the copper is selectively deposited with a deposition temperature of approximately 250 degrees centigrade and a deposition pressure of approximately 0.5 torr. Other chemistries, however, may also be used to selectively deposit copper. Alternatively, other conductive materials that can be selectively deposited such as tungsten may also be used. Moreover, the conductive layer may be also be deposited using a non-selective deposition process such as blanket chemical vapor deposition or sputter deposition. If the conductive layer is deposited using a non-selective process, then an additional etch back or polishing step may be used to remove a portion of the conductive layer and form a structure similar to that shown in FIG. 9.

Similarly, this alternative embodiment may also be used at other locations within integrated circuit structure 40 to form metallization, as previously described. Therefore, this alternative embodiment may also similarly be used to form contact, via, and interconnect metallization throughout integrated circuit structure 40.

The foregoing description and illustrations contained herein demonstrate many of the advantages associated with the present invention. In particular, contact, via, or interconnect metallization having a self-aligned diffusion barrier or seed layer can be formed with the present invention. This is clearly shown in FIG. 9 wherein remaining portion 24 of device layer 16 is self-aligned with respect to conductive layer 32. Moreover, because interconnect metallization can be formed with a self-aligned diffusion barrier or seed layer the horizontal distance separating adjacent metal lines within a given metal level can be reduced. Therefore, integrated circuits having high device packing densities and high performance can be fabricated with the present invention. Furthermore, in FIG.'S 5-9 dielectric layer 26 is formed prior to the deposition of conductive layer 32. Therefore, with the present invention dielectric isolation processes, which may adversely effect a given conductive layer, are performed prior to the formation of the conductive layer. Moreover, the present invention can be used throughout an integrated circuit structure to form metallization.

Thus it is apparent that there has been provided, in accordance with the invention, a method for forming metallization in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, device layer 16 in FIG.'S 4 and 13 may also be isotropically etched. Furthermore, it is not intended that the materials specifically mentioned be the only materials suitable for use in the present invention. Any material that provides the necessary properties of a given layer is suitable. For example, sacrificial layers 18 and 42 may be any material which can be removed without substantially altering the adjacent dielectric layer and the underlying portion of device layer 16. Moreover, it is not intended that the deposition or etch processes specifically mentioned be the only processes suitable for use in the present invention. For example, conductive layer 32 may also be selectively deposited using an electroless plating process. Furthermore, in certain applications device layer 16 may be formed with a dielectric material. Therefore, it is intended that this invention encompass all such variations and modifications as fall within the scope of the appended claims.

I claim:

1. A method for forming metallization in an integrated circuit comprising the steps of:
   providing a substrate;
   forming a first dielectric layer overlying the substrate;
   forming a conductive via through a portion of the first dielectric layer;
   forming a first conductive layer overlying the conductive via, wherein the first conductive layer is a metal containing layer;
   depositing a sacrificial layer of material overlying the first conductive layer;
   patterning the sacrificial layer to form a patterned portion of the sacrificial layer and to form an exposed portion of the first conductive layer, the pattern portion of the sacrificial layer having a top surface and a sidewall;
   etching the exposed portion of the first conductive layer to form a remaining portion of the first conductive layer underlying the patterned portion of the sacrificial layer and overlying the conductive via;
   forming a second dielectric layer adjacent to the sidewall of the patterned portion of the sacrificial layer after the remaining portion of the first conductive layer has been formed and exposing the top surface of the patterned portion of the sacrificial layer, wherein the second dielectric layer is substantially planar with the top surface of the patterned portion of the sacrificial layer
   removing the patterned portion of the sacrificial layer to expose the remaining portion of the first conductive layer and to form an exposed sidewall portion of the second dielectric layer; and
   depositing a second conductive layer onto the remaining portion of the first conductive layer.

2. The method of claim 1 wherein the step of depositing the second conductive layer is further characterized as selectively depositing the second conductive layer.

3. The method of claim 1 wherein the step of depositing the second conductive layer is further characterized as depositing copper.

4. The method of claim 1 further comprising the step of forming a sidewall spacer adjacent the exposed sidewall portion of the second dielectric layer.

5. The method of claim 1 wherein the step of forming the first conductive layer comprises forming said first conductive layer of at least one material selected from the group consisting of: titanium nitride, titanium-tungsten, tungsten, and molybdenum.

6. The method of claim 1, wherein the step of forming the second dielectric layer comprises:
   forming the second dielectric layer from a material selected from the group consisting of: silicon nitride, boron nitride, and boron oxynitride.

7. The method of claim 1, wherein the step of depositing the sacrificial layer comprises:
   depositing a material selected from the group consisting of: photoresist and polyimide.

8. A method for forming metallization in an integrated circuit comprising the steps of:
   providing a substrate;
   forming a first dielectric layer overlying the substrate;
   forming a conductive via through a portion of the first dielectric layer;
   forming a first conductive layer overlying the conductive via, wherein the first conductive layer is a metal containing layer;
   depositing a sacrificial layer of material overlying the first conductive layer;
   patterning the sacrificial layer to form an exposed portion of the first conductive layer and to form a patterned portion of the sacrificial layer, the patterned portion of the sacrificial layer having a top surface;
   etching the exposed portion of the first conductive layer to form a remaining portion of the first conductive layer underlying the patterned portion of the sacrificial layer and overlying the conductive via;
   forming a second dielectric layer overlying the substrate and the patterned portion of the sacrificial layer;
   removing a portion of the second dielectric layer to expose the top surface of the patterned portion of the sacrificial layer;
   removing the patterned portion of the sacrificial layer to expose the remaining portion of the first conductive layer and to form an exposed sidewall portion of the second dielectric layer; and
   depositing a second conductive layer onto the remaining portion of the first conductive layer.

9. The method of claim 8 wherein the step of depositing the second conductive layer is further characterized as selectively depositing the second conductive layer.

10. The method of claim 8 wherein the step of depositing the second conductive layer is further characterized as depositing copper.

11. The method of claim 8 further comprising the step of forming a sidewall spacer adjacent the exposed sidewall portion of the second dielectric layer.

12. The method of claim 8 wherein the step of forming the first conductive layer comprises forming said first conductive layer of at least one material selected from the group consisting of: titanium nitride, titanium-tungsten, tungsten, and molybdenum.

13. The method of claim 8 wherein the step of depositing the sacrificial layer of material is further characterized as depositing a dielectric layer.

14. The method of claim 8, wherein the step of forming the second dielectric layer comprises:
   forming the second dielectric layer from a material selected from the group consisting of: silicon nitride, boron nitride, and boron oxynitride.

15. The method of claim 8, wherein the step of depositing the sacrificial layer comprises:
   depositing a material selected from the group consisting of: photoresist and polyimide.

16. A method for forming metallization in an integrated circuit comprising the steps of:
   providing a substrate;
   forming a first dielectric layer overlying the substrate;
   forming a conductive via through a portion of the first dielectric layer;

forming a first conductive layer overlying the conductive via, wherein the first conductive layer is a metal containing layer;

depositing a sacrificial layer of material overlying the first conductive layer, wherein the sacrificial layer of material is selected from the group consisting of: photoresist and polyimide;

patterning the sacrificial layer of material to form an exposed portion of the first conductive layer and to form a patterned portion of the sacrificial layer, the patterned portion of the sacrificial layer having a top surface;

etching the exposed portion of the first conductive layer to form a remaining portion of the first conductive layer underlying the patterned portion of the sacrificial layer and overlying the conductive via;

forming a second dielectric layer overlying the substrate and the patterned portion of the sacrificial layer;

removing a portion of the second dielectric layer to expose the top surface of the patterned portion of the sacrificial layer;

removing the patterned portion of the sacrificial layer to expose the remaining portion of the first conductive layer and to form an exposed sidewall portion of the second dielectric layer; and depositing a second conductive layer onto the remaining portion of the first conductive layer.

17. The method of claim 16 wherein the step of depositing the second conductive layer is further characterized as selectively depositing the second conductive layer.

18. The method of claim 16 wherein the step of depositing the second conductive layer is further characterized as depositing copper.

19. The method of claim 16 further comprising the step of forming a sidewall spacer adjacent the exposed sidewall portion of the second dielectric layer.

20. The method of claim 16 wherein the step of forming the first conductive layer comprises forming said first conductive layer of at least one material selected from the group consisting of: titanium nitride, titanium-tungsten, tungsten, and molybdenum.

* * * * *